(12) United States Patent
Lee et al.

(10) Patent No.: US 7,944,296 B1
(45) Date of Patent: May 17, 2011

(54) LOW POWER MODE AMPLIFICATION WITH A TRANSFORMER OUTPUT MATCHING AND A VIRTUAL GROUND

(75) Inventors: Chang-Ho Lee, Marietta, GA (US); Kyu Hwan An, Irvine, CA (US); Yunseo Park, Norcross, GA (US)

(73) Assignee: Samsung Electro-Mechanics Company (KR)

( * ) Notice: Subject to any disclaimer, the term of this patent is extended or adjusted under 35 U.S.C. 154(b) by 0 days.

(21) Appl. No.: 12/722,990

(22) Filed: Mar. 12, 2010

(51) Int. Cl.
*H03F 1/00* (2006.01)

(52) U.S. Cl. .......................... 330/195; 330/154

(58) Field of Classification Search ................. 330/195, 330/124 R, 154, 171, 188
See application file for complete search history.

(56) References Cited

U.S. PATENT DOCUMENTS

| | | | |
|---|---|---|---|
| 3,778,730 A * | 12/1973 | Cromwell et al. | 331/109 |
| 5,661,434 A | 8/1997 | Brozovich et al. | |
| 6,737,916 B2 * | 5/2004 | Luu | 330/10 |
| 7,348,841 B2 | 3/2008 | Kim et al. | |
| 7,675,365 B2 * | 3/2010 | Lee et al. | 330/295 |
| 7,728,661 B2 * | 6/2010 | Bockelman et al. | 330/51 |
| 2008/0164941 A1 * | 7/2008 | Lee et al. | 330/124 R |
| 2009/0174477 A1 * | 7/2009 | Lee et al. | 330/195 |
| 2009/0273397 A1 * | 11/2009 | Bockelman et al. | 330/51 |

* cited by examiner

*Primary Examiner* — Henry K Choe
(74) *Attorney, Agent, or Firm* — Sutherland Asbill & Brennan LLP

(57) ABSTRACT

A power amplifier system in accordance with an example embodiment can utilize a transformer having a primary winding inductively coupled to a secondary winding, where the primary winding includes a center tap between a first port and a second port, where the secondary winding includes a third port and a fourth port, where the primary winding receives a first output from a first amplifier, where the center tap receives a second output from a second amplifier. The system can also include a first capacitor connected to the center tap and the first port; a second capacitor connected to the center tap and the second port; a first switch in electrical connection with the center tap, where the first switch can connect the center tap to a ground port; a second switch connected to the fourth port, where the second switch can connect the fourth port to a common node in electrical connection with the center tap; and a third capacitor connected between the common node and an output node connected to the third port from a system output can be obtained.

20 Claims, 5 Drawing Sheets

LOW POWER MODE AMPLIFICATION WITH A TRANSFORMER OUTPUT MATCHING AND A VIRTUAL GROUND

FIELD OF INVENTION

Embodiments of the invention relate generally to power amplifiers, and more particularly, to systems and methods for low-power mode amplification with a transformer output matching and a virtual ground.

BACKGROUND OF THE INVENTION

An operation of a power amplifier does not need to be at a fixed output power. More often, power amplifiers are used in a low output power backed off from their peak output power. However, simple back-off power amplifiers waste current by using more current than necessary. Thus, it is more desirable to have a separate amplification path for low output power operation in order to allow for reduced current conduction.

However, the isolation between high-power mode and low-power mode is often imperfect so that each mode is out of its optimum condition, thereby degrading the performance. An isolation switch can be used for the purpose of isolation. But the operation of power amplifiers often generates large voltage swing, which if exceeds the limit of safe device operation range, especially for CMOS devices, a certain form of damage to the device is inevitable.

FIG. 1 illustrates a block diagram of a conventional dual mode power amplifier for high power and low power. As shown in FIG. 1, there is a high-power mode amplifier 101 and a low-power amplifier 104. However, the high output power of the high-power mode amplifier 101 in FIG. 1 generates high voltage swing at the output, and the operation of the switch 103 is under a high voltage stress, which can often exceed the limit of safe operation range of a given device for the switch 103. Therefore, a simple connection of a switch 103 to the output node is not desirable. While an operation of the switch 103 is desirable for an optimum isolation between the high power mode and the low power mode, such a switch 103 should be carefully operated within an allowed operation margin.

Therefore, an integration of high power mode and low power mode to handle high voltage stress is desirable in an efficient power amplifier operation.

BRIEF SUMMARY OF THE INVENTION

According to an example embodiment of the invention, there is a power amplifier system. The system may include a high-power amplifier; a transformer having a primary winding inductively coupled to a secondary winding, where the primary winding includes a first end or port, a second end or port, and a center tap between the first end or port and the second end or port, where the secondary winding includes a third end or port and a fourth end or port, where respective outputs of the high-power amplifier are connected to the first end or port and the second end or port of the primary winding; a first capacitor connected to the center tap and the first end or port of the primary winding; and a second capacitor connected to the center tap and the second end or port of the primary winding. The system may also include a low-power amplifier, where an output of the low-power amplifier is connected to the center tap port of the primary winding; a first switch connected to the center tap via a capacitive coupling element, where the first switch is operative to connect the center tap of the primary winding to a ground port; a second switch connected to the fourth end or port of the secondary winding, where the second switch is operative to connect the fourth end or port to a common node, the common node connected to the center tap of the primary winding via the capacitive coupling element; and a third capacitor connected between the common node and an output node connected to the third end or port of the secondary winding, where a system output is obtained from the output node.

According to another example embodiment, there is a system. The system may include a transformer having a primary winding inductively coupled to a secondary winding, where the primary winding includes a first end or port, a second end or port, and a center tap between the first end or port and the second end or port, where the secondary winding includes a third end or port and a fourth end or port, where the primary winding is configured to receive a first output from a first amplifier, where the center tap is configured to receive a second output from a second amplifier; a first capacitor connected to the center tap and the first end or port of the primary winding; and a second capacitor connected to the center tap and the second end or port of the primary winding. The system may also include a first switch in electrical connection with the center tap, where the first switch is operative to connect the center tap of the primary winding to a ground port; a second switch connected to the fourth end or port of the secondary winding, where the second switch is operative to connect the fourth end or port to a common node, the common node in electrical connection with the center tap of the primary winding; and a third capacitor connected between the common node and an output node connected to the third end or port of the secondary winding, where a system output is obtained from the output node.

BRIEF DESCRIPTION OF THE DRAWINGS

Figure 1:
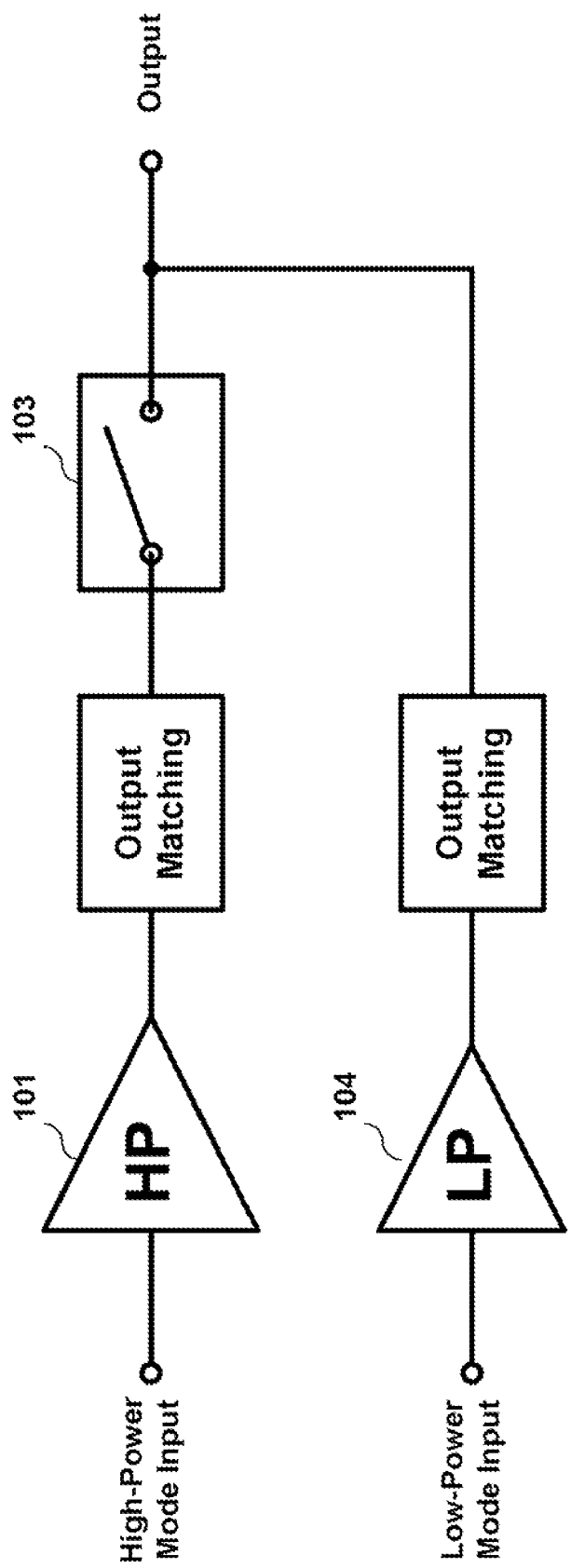

Having thus described the invention in general terms, reference will now be made to the accompanying drawings, which are not necessarily drawn to scale, and wherein:

FIG. 1 illustrates a block diagram of a conventional dual mode power amplifier for high power and low power.

Figure 2:
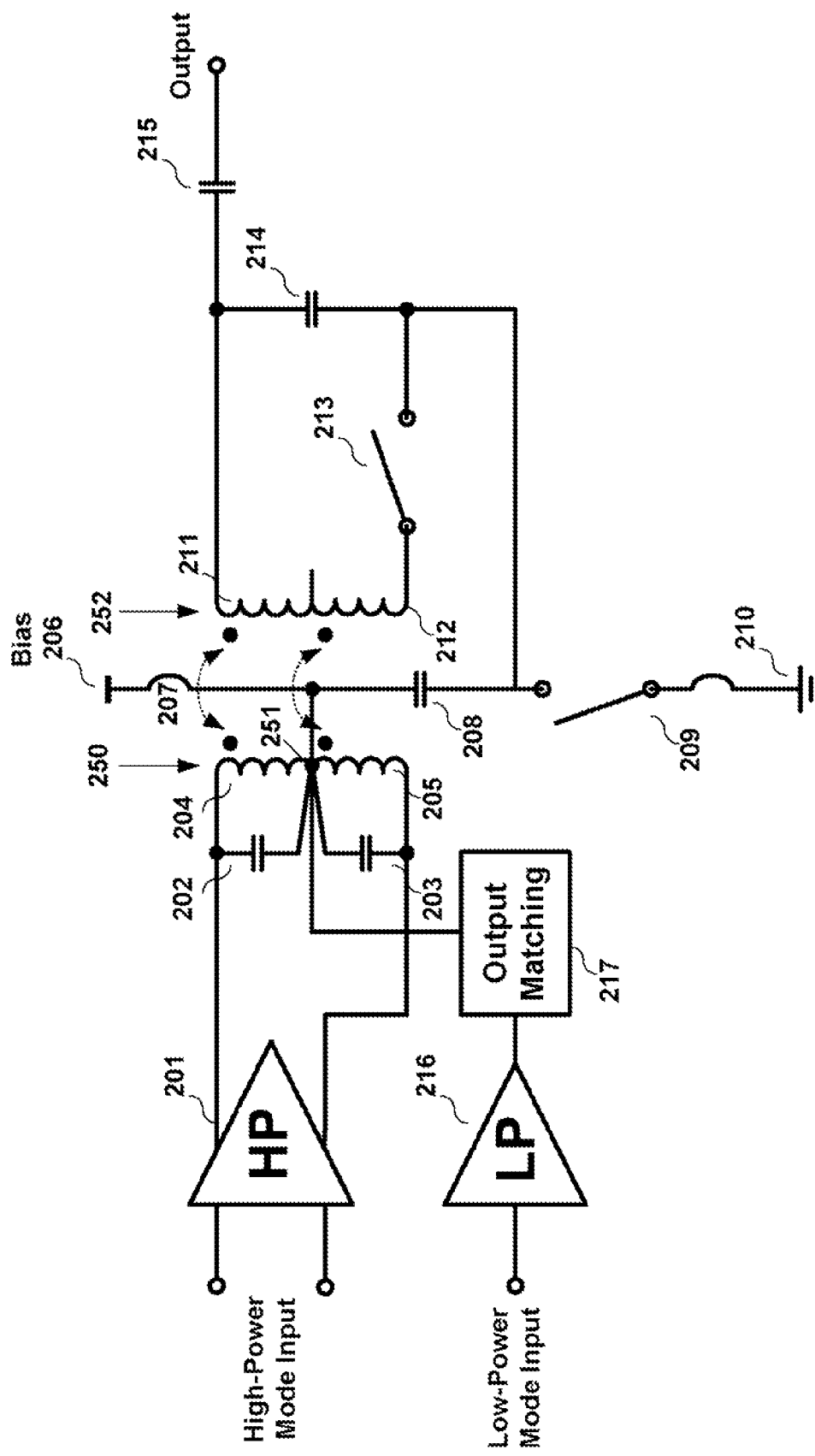

FIG. 2 illustrates an example system for dual-mode power amplification in which an output of a low-power amplifier is connected to a virtual ground of a primary winding of a transformer, according to an example embodiment of the in invention.

Figure 3:
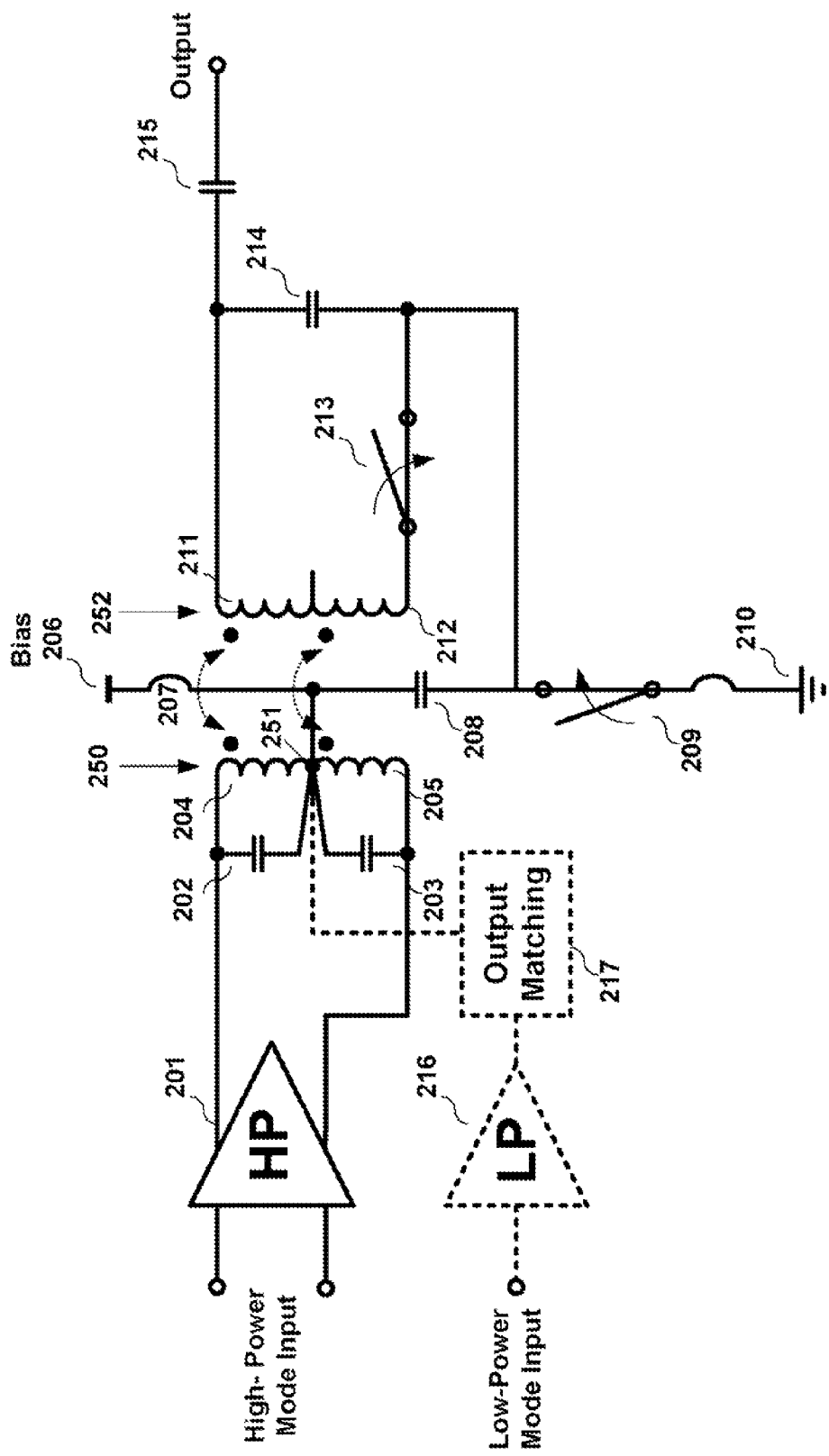

FIG. 3 illustrates an example configuration of the system of FIG. 2 in which the high-power mode in enabled while the low-power mode is disabled, according to an example embodiment of the invention.

Figure 4:
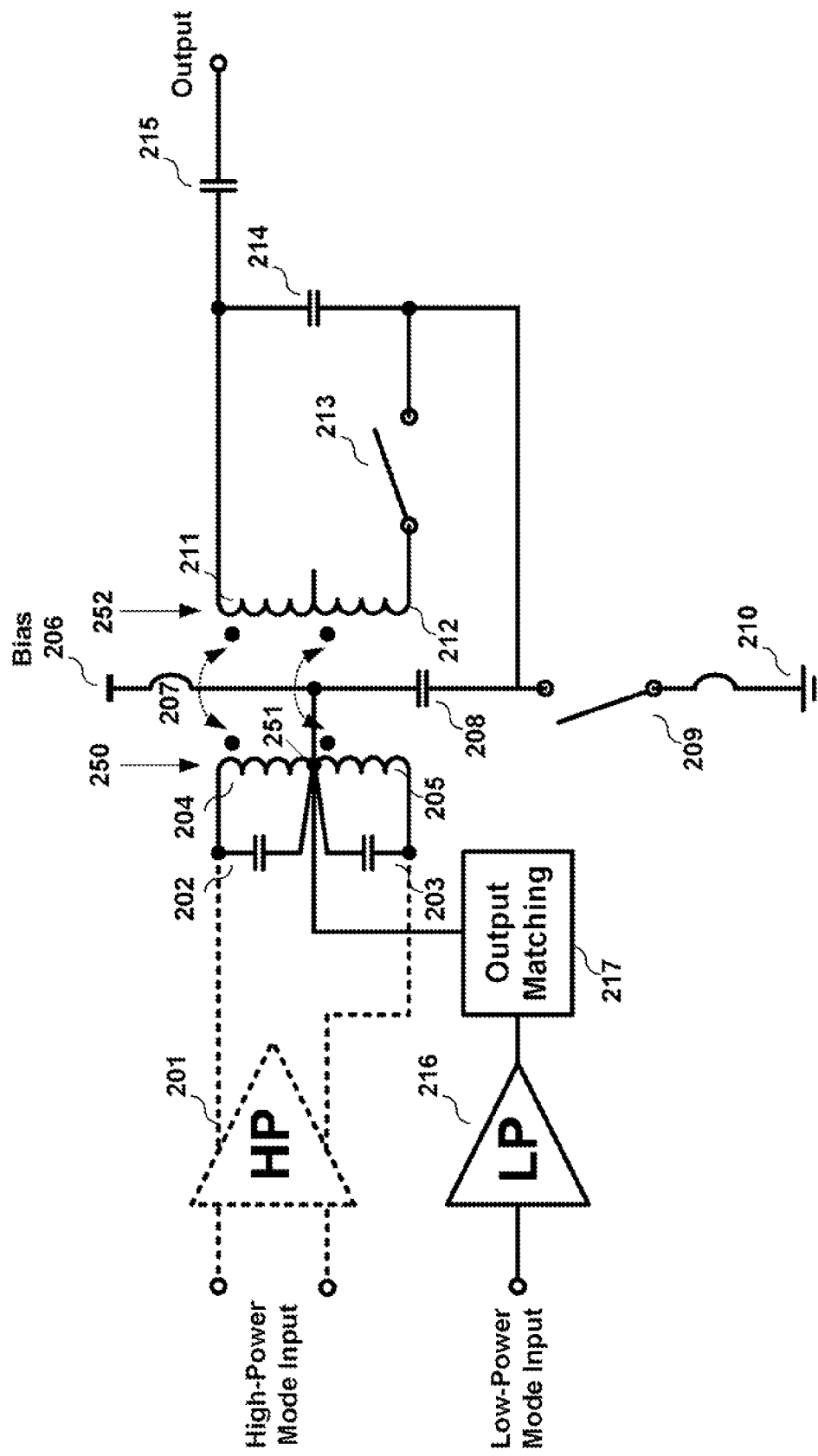

FIG. 4 illustrates an example configuration of the system of FIG. 2 in which the low-power amplifier mode is enabled while the high-power mode is disabled, according to an example embodiment of the invention.

Figure 5:
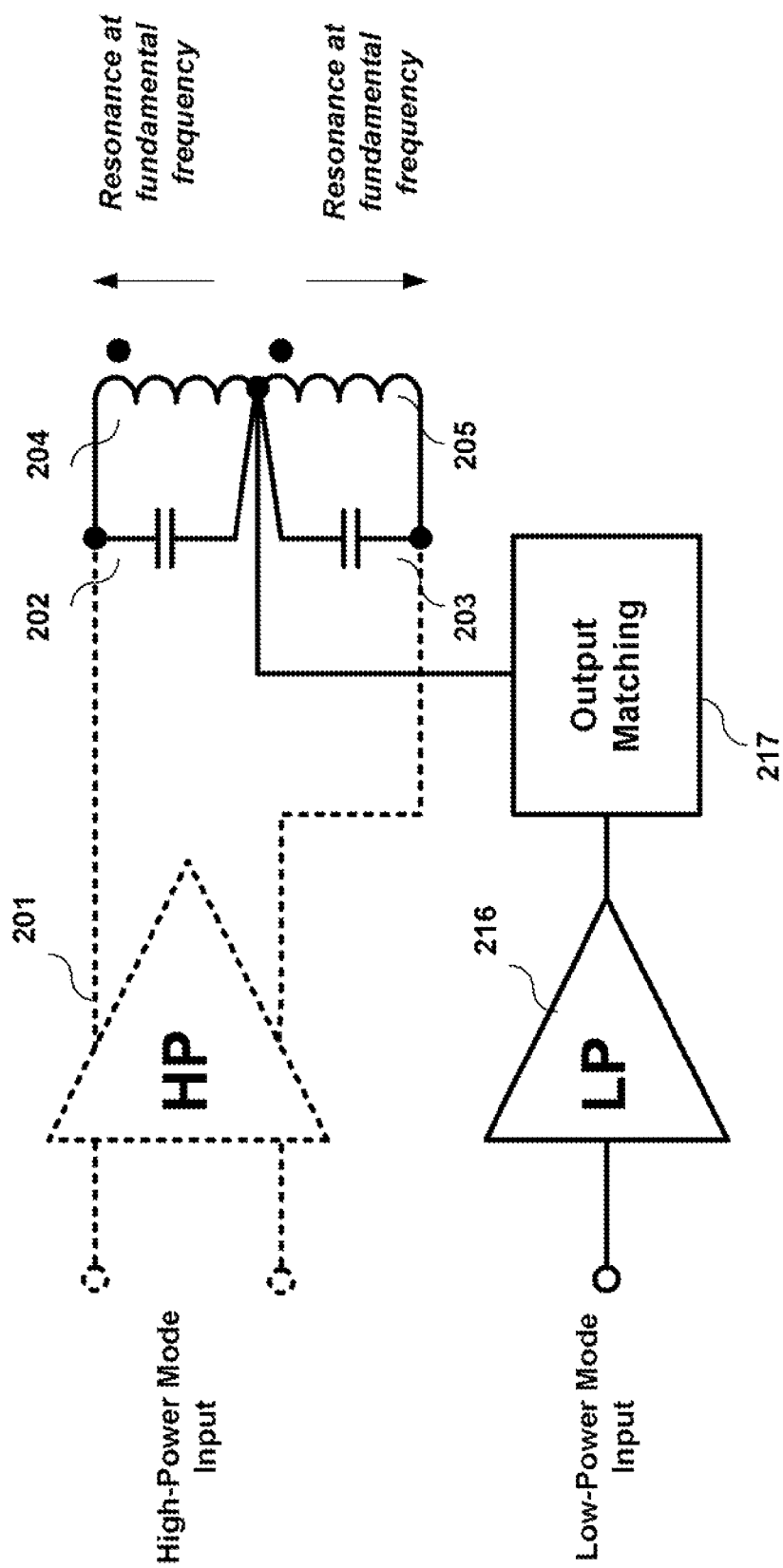

FIG. 5 illustrates an example illustration in which the low-power mode has two resonance blocks looking into the high power mode, according to an example embodiment of the invention.

DETAILED DESCRIPTION OF THE INVENTION

Example embodiments of the invention now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

FIG. 2 illustrates an example block diagram of dual-mode power amplification in which an output of a low-power amplifier is connected to a virtual ground of a primary winding of a transformer, according to an example embodiment of the in invention. In FIG. 2, there is a high-power (HP) amplifier 201 and a low-power (LP) amplifier 216. The high-power mode amplifier 201 may operate with as a differential amplifier, thus receiving differential inputs and generating corresponding differential outputs. On the other hand, both the input and the output of the low-power amplifier 216 may be respective single-ended signals, according to an example embodiment of the invention. In general, the high-power amplifier 201 generates provides high amplification levels, and thus larger voltage swings, than the low-power amplifier 216, according to an example embodiment of the invention.

The output matching for the high-power amplifier 201 may include a transformer comprising at least a primary windings 250 and a secondary winding 252. The primary winding may be comprised of a first winding or segment 204 and a second winding or segment 205. While the first winding or segment 204 and the second winding or segment 205 are illustrated as two distinct two distinct windings or segments connected in series, they could also be respective portions of a single winding as well. Likewise, the secondary winding 252 may be comprised of a first winding or segment 211 and a second winding or segment 212. Similarly, while the first winding or segment 211 and the second winding or segment 212 are illustrated as two distinct two distinct windings or segments connected in series, they could also be respective portions of a single winding as well.

The differential outputs of the high-power amplifier 201 may be connected to the primary winding 250 of the transformer. More specifically, a first differential output may be connected to a first end or port of the first winding or segment 204. A second end or port of the first winding or segment 204 may be connected to a first end or port of the second winding or segment 205. The second end or port of the second winding or segment 205 may be connected to a second differential output of the high-power amplifier 201.

A center tap port 251 may be provided in the primary winding 250 between the first winding or segment 204 and the second winding or segment 205. The center tap port 251 of the primary winding 250 may be an AC virtual ground point. For DC biasing of the amplifiers 201, 216, the center tap port 251 may be used as a DC reference for connecting to a DC bias source 206 via an RF choke 207. Ideally, no AC signal is observed at the center tap port 251, although in actual operation a small amount of AC signal may be tolerated without departing from example embodiments of the invention. The center tap port 251 may also be connected via a capacitive coupling element 208 (e.g., a capacitor) to a first switch 209, which controls a connection to a ground port 210 via an RF choke 209. The first switch 209 may be opened or closed for low-power mode or high-power mode operations, as described herein.

A single-ended output of low-power amplifier 216 may be connected to the center tap port 251 of the primary winding 250 via an output matching block 217. In general, the output matching block 217 may provide impedance matching between the output of the low-power amplifier 216 and the center tap port 251.

In addition, a first capacitor 202 may be connected between the first end or port of the first winding or segment 204 and the center tap port 251 such that the first capacitor 202 is configured in parallel with the first winding or segment 204. Likewise, a second capacitor 203 may be connected between the center tap port 251 and the second end or port of the second winding or segment 205 such that the second capacitor 203 is configured in parallel with the second winding or segment 205. The first and second capacitors 202, 203 may be utilized with the corresponding first or second windings or segments 204, 205 to generate resonance blocks for isolating low-power mode operations from high-power mode operations, as described herein.

Turning now to the secondary winding 252, the first winding or segment 211 may have a first end or port that is part of an output node from which a system output port can be obtained via a DC blocking capacitor 215. The second end or port of the first winding or segment 211 may be connected to a first end or port of the second winding or segment 212. The second end or port of the second winding or segment 212 may be connected to a first port or end of a second switch 213. The second port or end of the second switch 213 is connected to a common node, which may be connected to a node between the capacitive coupling element 208 and the first switch 209, and a first end or port of a capacitor 214. The second end or port of the capacitor 214 may be connected to the output node from which a system output port can be obtained via a DC blocking capacitor 215. The second switch 213 may be opened for closed for low-power mode or high-power mode operations, as described herein.

FIG. 3 illustrates an example configuration of the system of FIG. 2 in which the high-power mode in enabled while the low-power mode is disabled, according to an example embodiment of the invention. During high-power mode, the high-power amplifier 201 may be operated while the low-power amplifier 216 may not be operated. As shown in FIG. 3, the first switch 209 may closed to in order to provide a conductive path to the ground port 210 for the center tap port 251 via the capacitive coupling element 208. In this case, the output of the low-power amplifier 216 may be connected to the ground port 210. It will be appreciated that the low-power mode connected to ground via the ground port 210 cannot affect the high-power mode with good isolation. In addition, the second switch 213 may also be closed to connect the second end or port of the second winding or segment 212 to ground via the ground path provided by the closed first switch 209. It will be appreciated that in the high-power mode, the switches 209, 213 are closed for conduction so that no stress resides on operations of the respective switches 209, 213.

In FIG. 3, the differential outputs of the high-power mode amplifier 201 are received by the primary winding 250, which is inductively coupled to the secondary winding 252. Given that the second end or port of the second winding or segment 212 may be connected to the ground port 210 via the closing of switches 209, 213, the secondary winding generates a single-ended signal at the first end or port of the first winding or segment 211, which is available at the output node and processed by DC blocking capacitor 215 to provide the system output.

FIG. 4 illustrates an example configuration of the system of FIG. 2 in which the low-power amplifier mode is enabled while the high-power mode is disabled, according to an example embodiment of the invention. During the low-power mode, the low-power amplifier 216 may be operated while the high-power amplifier 201 may not be operated. It will be appreciated that the low-power mode (associated with low-power amplifier 216) is isolated at the operating frequency from the high power mode (associated with high-power amplifier 201) due to the equivalent resonance block provided by the parallel configuration of capacitors 202, 203 with respective segments or windings 204, 205. More specifically, respective capacitance values for capacitors 202, 203 may be selected in accordance with inductance values for respective segments or windings 204, 205 such that each parallel configuration creates an equivalent resonance block that resonates at an operating frequency, as illustrated by FIG. 5. The operating frequency associated with the output of the low-power amplifier 216 may be isolated based with respect to the virtual ground provided by the center tap point 251. Thus, from the center tap point 251, the signal path for the low power mode may then follow a series capacitive path provided by capacitors 208, 214 to the output node, which does not result in any significant signal loss compared to series inductive paths.

Accordingly, since the switches 209, 213 described herein are used only for low signal swings (e.g., only the open states are typically subject to voltage level stress), the size of the switches utilized herein can be minimized based upon the voltage level of the low-power mode. Also, the isolation between the high power mode and the low power mode can be enforced even with simple switching operation by effectively connecting the low power mode to a virtual ground at the center tap of the primary winding, and the high power mode to two equivalent resonance blocks. In addition, the DC bias source 206 may be shared for both high and low-power mode operations, thereby minimizing the number of bonding wires or methods for outer connections. Accordingly, example embodiments of the invention may provide good isolation with minimum loss for both high-power mode and low-power mode operations while utilizing simplified topologies and components.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A power amplifier system, comprising:
    a high-power amplifier;
    a transformer having a primary winding inductively coupled to a secondary winding, wherein the primary winding includes a first end or port, a second end or port, and a center tap between the first end or port and the second end or port, wherein the secondary winding includes a third end or port and a fourth end or port, wherein respective outputs of the high-power amplifier are connected to the first end or port and the second end or port of the primary winding;
    a first capacitor connected to the center tap and the first end or port of the primary winding;
    a second capacitor connected to the center tap and the second end or port of the primary winding;
    a low-power amplifier, wherein an output of the low-power amplifier is connected to the center tap port of the primary winding;
    a first switch connected to the center tap via a capacitive coupling element, wherein the first switch is operative to connect the center tap of the primary winding to a ground port;
    a second switch connected to the fourth end or port of the secondary winding, wherein the second switch is operative to connect the fourth end or port to a common node, the common node connected to the center tap of the primary winding via the capacitive coupling element; and
    a third capacitor connected between the common node and an output node connected to the third end or port of the secondary winding, wherein a system output is obtained from the output node.

2. The system of claim 1, wherein the center tap is at an AC virtual ground.

3. The system of claim 1, wherein the center tap is further connected to a DC bias source.

4. The system of claim 1, wherein during a high-power mode, the high-power amplifier is enabled while the low-power amplifier is disabled, wherein the first switch is closed to connect the center tap to the ground port, wherein the second switch is closed to connect the fourth port to the common node, the common node connected to the center tap and the ground port.

5. The system of claim 4, wherein the respective outputs of the high-power amplifier are converted by the transformer to a single-ended signal at the third end or port of the secondary winding that is associated with the output node.

6. The system of claim 5, wherein the respective outputs of the high-power amplifier comprise a pair of differential outputs.

7. The system of claim 1, wherein during a low-power mode, the high-power amplifier is disabled while the low-power amplifier is enabled, wherein the first switch is opened to disconnect the center tap from the ground port, wherein the second switch is opened to disconnect the fourth port from the common node.

8. The system of claim 7, wherein the output of the low-power amplifier is provided to the output node from the center tap port via a series connection of the capacitive coupling element and the third capacitor.

9. The system of claim 1, further comprising an output matching network, wherein the output of the low-power amplifier is connected to the center tap of the primary winding via the output matching network.

10. The system of claim 1, wherein the first and second capacitors operate in parallel with respective portions of the primary winding to provide respective equivalent resonance blocks.

11. The system of claim 10, wherein the respective equivalent resonance blocks are operative at an operational frequency to isolate the output of the low-power amplifier from the respective outputs of the high-power amplifier.

12. The system of claim 1, wherein the primary winding includes at least a first winding or segment and a second segment or winding connected in series, the first winding or segment associated with the first end or port and the center tap, and the second winding or segment associated with the center tap and the second end or port.

13. A system, comprising:
    a transformer having a primary winding inductively coupled to a secondary winding, wherein the primary winding includes a first end or port, a second end or port, and a center tap between the first end or port and the second end or port, wherein the secondary winding includes a third end or port and a fourth end or port, wherein the primary winding is configured to receive a first output from a first amplifier, wherein the center tap is configured to receive a second output from a second amplifier;
    a first capacitor connected to the center tap and the first end or port of the primary winding;

a second capacitor connected to the center tap and the second end or port of the primary winding;

a first switch in electrical connection with the center tap, wherein the first switch is operative to connect the center tap of the primary winding to a ground port;

a second switch connected to the fourth end or port of the secondary winding, wherein the second switch is operative to connect the fourth end or port to a common node, the common node in electrical connection with the center tap of the primary winding; and a third capacitor connected between the common node and an output node connected to the third end or port of the secondary winding, wherein a system output is obtained from the output node.

14. The system of claim 13, wherein the center tap is at an AC virtual ground.

15. The system of claim 13, wherein the center tap is further connected to a DC bias source.

16. The system of claim 13, wherein the first output of the first amplifier comprises a pair of differential outputs, wherein the first end or port and the second end or port of the primary winding receives the pair of differential outputs.

17. The system of claim 13, wherein during a high-power mode, the first amplifier is enabled while the second amplifier is disabled, wherein the first switch is closed to connect the center tap to the ground port, wherein the second switch is closed to connect the fourth port to the common node, the common node connected to the center tap and the ground port.

18. The system of claim 13, wherein during a low-power mode, the first amplifier is disabled while the second amplifier is enabled, wherein the first switch is opened to disconnect the center tap from the ground port, wherein the second switch is opened to disconnect the fourth port from the common node.

19. The system of claim 18, wherein the second output of the low-power amplifier is provided to the output node from the center tap port via a series connection of the capacitive coupling element and the third capacitor.

20. The system of claim 13, wherein the first and second capacitors operate in parallel with respective portions of the primary winding to provide respective equivalent resonance blocks.

* * * * *